US006441715B1

(12) United States Patent
Johnson

(10) Patent No.: US 6,441,715 B1
(45) Date of Patent: Aug. 27, 2002

(54) METHOD OF FABRICATING A MINIATURIZED INTEGRATED CIRCUIT INDUCTOR AND TRANSFORMER FABRICATION

(75) Inventor: F. Scott Johnson, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/505,051

(22) Filed: Feb. 16, 2000

Related U.S. Application Data

(60) Provisional application No. 60/120,374, filed on Feb. 17, 1999.

(51) Int. Cl.[7] ................................................. H01F 5/00
(52) U.S. Cl. ...................... 336/200; 336/223; 29/602.1; 29/606
(58) Field of Search ................................ 29/602.1, 605, 29/607; 336/200, 223, 232

(56) References Cited

U.S. PATENT DOCUMENTS

| | | | | |
|---|---|---|---|---|
| 5,719,545 A | * | 2/1998 | Johnson | 336/180 |
| 5,802,702 A | * | 9/1998 | Fleming et al. | 29/608 |
| 6,013,939 A | * | 1/2000 | El-Sharawy et al. | 257/531 |
| 6,030,877 A | * | 2/2000 | Lee et al. | 438/381 |
| 6,103,405 A | * | 8/2000 | Tomita | 428/692 |
| 6,171,716 B1 | * | 1/2001 | Sasaki et al. | 428/692 |

* cited by examiner

*Primary Examiner*—Anh Mai
(74) *Attorney, Agent, or Firm*—Peter K. McLarty; W. James Brady, III; Frederick J. Telecky, Jr.

(57) ABSTRACT

A method for fabricating inductors and transformers on integrated circuits. A magnetic material is formed on the semiconductor substrate. The magnetic material comprises a suspension of magnetic material in an insulator. A metal film is formed that forms at least one coil around the magnetic material forming an inductor structure. Two adjacent coils can be linked with the magnetic material to form a transformer.

14 Claims, 3 Drawing Sheets

US 6,441,715 B1

METHOD OF FABRICATING A MINIATURIZED INTEGRATED CIRCUIT INDUCTOR AND TRANSFORMER FABRICATION

This application claims priority under 35 USC §119(e) (1) of provisional U.S. application Ser. No. 60/120,374 filed Feb. 17, 1999.

FIELD OF THE INVENTION

The invention is generally related to the field of semiconductor device fabrication and more specifically to a method for fabricating inductors and transformers on integrated circuits

BACKGROUND OF THE INVENTION

As more circuit components are being integrated on-chip there is an increasing need for integrated circuit inductors. Inductors in integrated circuits have a number of important uses in providing on-chip filtering and voltage conversion. Currently, the majority of inductors used are discrete off-chip devices that require connection to the integrated circuit (IC). The leads used for the connection adds series resistance and capacitance to the overall circuit and therefore affect the performance of the circuit. In addition, there is an additional cost associated with these discrete external inductors.

With the current trends towards system-on-a-chip integrated circuits, it is often the case that a number of different supply voltages are required on the integrated circuit. Typically, a single voltage is supplied to the IC and the remaining required voltages are obtained through voltage conversion. On-chip voltage conversion usually requires an IC transformer and filtering. This filtering is performed using capacitors and inductors. IC transformer fabrication requires efficient coupling of inductive coils and relatively large values of inductance.

Currently, IC inductors are typically fabricated as a coil in a single level of metal or using a system of multiple metal levels along with vias connecting the metal levels. Here, the core of the inductor will be the interlevel dielectric material which in most cases will be silicon dioxide. The fabrication of integrated circuit inductors with large inductance values having $SiO_2$ as the core is made difficult due to the low relative permeability of $SiO_2$ and the presence of traps and other defects in the $SiO_2$ layer. If a large number of turns are used to increase the inductance, the silicon surface area required becomes prohibitively large.

Using current fabrication methods, large value inductors take up a large amount of silicon surface area making their use in current IC technology impractical.

SUMMARY OF THE INVENTION

The instant invention describes a method for fabricating a miniaturized integrated circuit inductor and transformer.

An embodiment of the instant invention is a method of forming an inductor in a semiconductor substrate with an upper surface, said method comprising the steps of: forming a magnetic structure on said semiconductor substrate; and forming a metal structure on said upper surface of said semiconductor substrate such that a magnetic flux is induced in said magnetic film. Another embodiment of the instant invention is a method of forming an inductor in a semiconductor substrate with a upper surface, said method comprising the steps of: forming a first magnetic structure on said semiconductor substrate; forming a first insulating layer on said first magnetic film; forming a second magnetic structure on said first insulating layer; forming a metal structure on said second first insulating layer such that said metal film induces a magnetic flux in said second magnetic film; forming a second insulating layer with an upper surface on said first insulating layer wherein said second insulating layer encases said second magnetic film and said metal film; and forming a third magnetic film on said second insulating layer.

Another embodiment of the instant invention is an integrated circuit transformer in a semiconductor substrate comprising: a first metal film with a first pattern; a continuous magnetic layer above said first metal film; a second metal film above said magnetic film with a second pattern; a plurality of electrically conducting contacts between said first metal film and said second metal film wherein said first metal film, said second metal film, and said electrically conducting contacts form two adjacent coils with each coil having at least one turn around said magnetic film.

DETAILED DESCRIPTION OF THE INVENTION

The invention will now be described with reference to FIGS. 1–5. It will be apparent to those of ordinary skill in the art that the benefits of the invention can be applied to other inductor and transformer structures. In this disclosure, the term "magnetic" refers to a material with paramagnetic, ferromagnetic, or ferrimagnetic properties which can be used to modify the magnetic field and therefore the inductance of the coil. It also refers to a diamagnetic material (eg. silver or lead) which may be used to reduce the magnetic field in all or a given portion of a coil or the area around a coil.

Figure 1A:
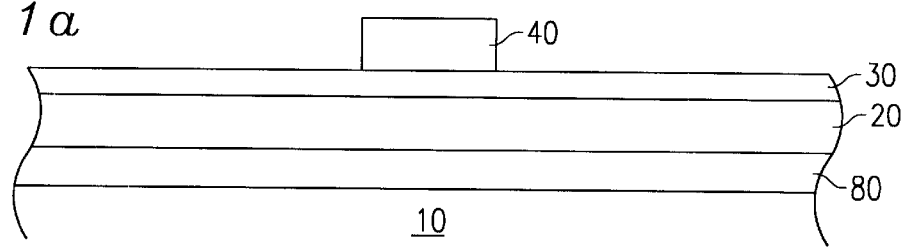
FIGS. 1a–1c are cross-sectional diagrams illustrating one embodiment of the instant invention.
Figure 1B:
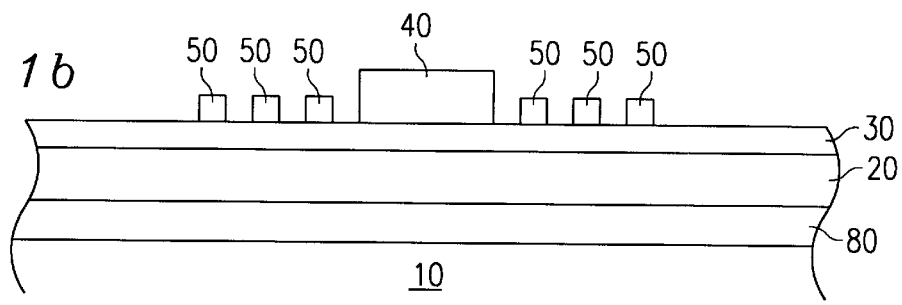

For an embodiment of the instant invention, a semiconductor substrate 10 with a dielectric layer 80 is shown in FIG. 1a. The substrate 10 is preferably comprised of single-crystal silicon or an epitaxial silicon layer formed on a single-crystal silicon body and may have existing circuits fabricated in other areas which are not shown for clarity. The dielectric layer 80 preferably comprises an oxide, a nitride, or any combination thereof. As shown in FIG. 1, a first magnetic layer 20 is formed on the surface of the dielectric material 80. In one embodiment this first magnetic layer comprises a Ni, Ni—Cu—Cr, or Mn—Zn-Ferrite film. However magnetic layer 20 may be comprised of any magnetic film compatible with semiconductor processing technology. In another embodiment, the first magnetic layer 20 comprises a stack of alternating layers of magnetic material and an insulating material. The magnetic material in the stack is preferably comprised of Ni, Ni—Cu—Cr, Mn—Zn-Ferrite film or any magnetic film compatible with semiconductor processing technology. The insulating material in the stack preferably comprises silicon oxide, silicon nitride, photoresist, polymers, any combination thereof, or any insulator compatible with semiconductor processing. In another embodiment, the first magnetic layer 20, comprises a suspension of magnetic material in an insulator. The suspended magnetic material preferably comprises Ni, Ni—Cu—Cr, Mn—Zn-Ferrite, or any magnetic material. The insulator material containing the suspension of magnetic material preferably comprises a polymer, polyamide, silicon oxide, photoresist, BPSG, PSG, HSQ, spin-on-glass, aerogel or xerogel. The insulator material should comprise a material that is easily flowed unto the substrate and to which the suspension of magnetic material is easily added. A first insulator layer 30 is formed on the surface of the first magnetic layer 20. In one embodiment, the first insulator layer 30 comprises oxide, polymer, polyamide, photoresist, BPSG, PSG, HSQ, spin-on-glass, aerogel, xerogel, a nitride, or any combination thereof. A second magnetic layer 40 is formed on the surface of the first insulator layer 30, and patterned using standard photolithographic techniques. The second magnetic layer 40 may be comprised of the same material as the first magnetic layer 20. As illustrated in FIG. 1b, a metal film is formed on the surface of the first insulator layer 30, and patterned to form a coil 50. In an embodiment of the instant invention, the metal film 50 comprises Al, Cu, Ti, W, Mo, Co, Pt, Pd, or any combination thereof. FIG. 2 illustrates an embodiment of the coil 50. Such a coil 50 should comprise at least one turn and is not limited to any particular shape.

Figure 1C:
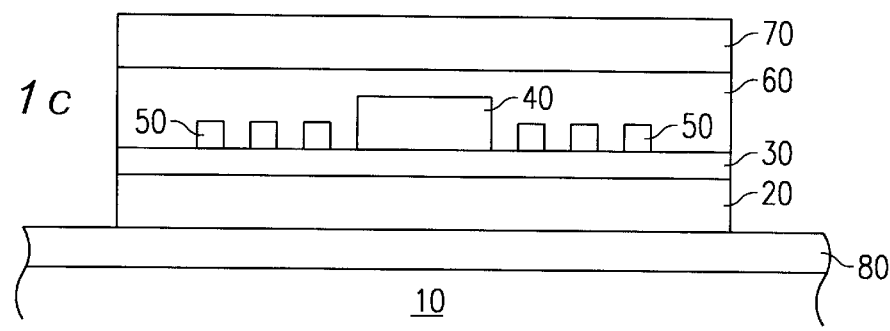
Figure 2:
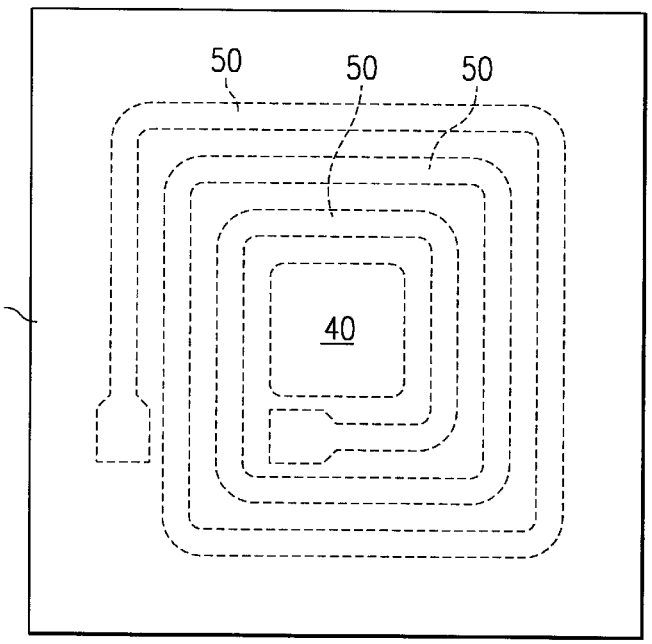
FIG. 2 is a top view of an embodiment of the instant

Referring to FIG. 1c, a second insulator layer 60 is formed encasing the coil 50 and the second magnetic material 40. Second insulator layer 60 may be comprised of oxide, polymer, polyamide, photoresist, BPSG, PSG, HSQ, spin-on-glass, aerogel, xerogel, a nitride, or any combination thereof. A third magnetic layer 70 is formed on the surface of the second insulator layer 60. The stack formed by the third magnetic layer 70 and second insulator layer 60 is patterned using standard photolithographic techniques resulting in the structure illustrated in FIG. 1c. A top down view of the completed structure is shown in FIG. 2.

An advantage of the embodiment of the instant invention shown in FIG. 1c and FIG. 2 is that large value inductors can be fabricated over a semiconductor wafer and integrated with other devices. In addition, the magnetic layers 20 and 70 will contain the magnetic field to within a small distance beyond these layers thereby reducing the interaction between the magnetic field produced by the coil 50 and any nearby circuits or circuit elements.

Figure 3A:
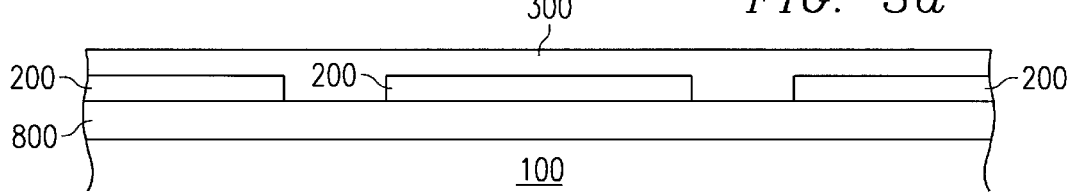
FIGS. 3a–3c are cross-sectional diagrams illustrating an embodiment of the instant invention.
Figure 3B:
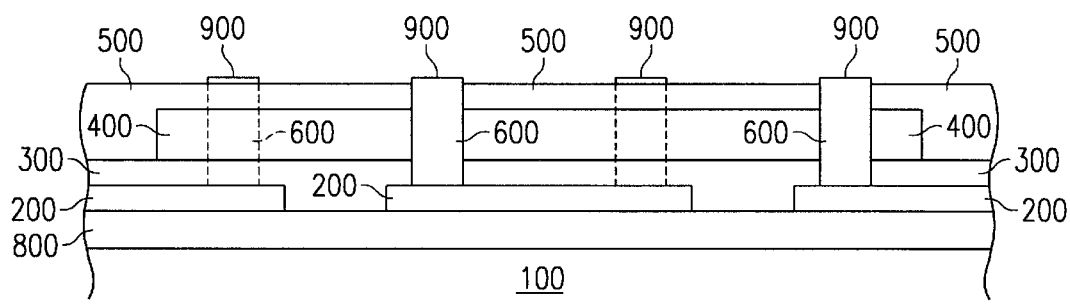
Figure 3C:
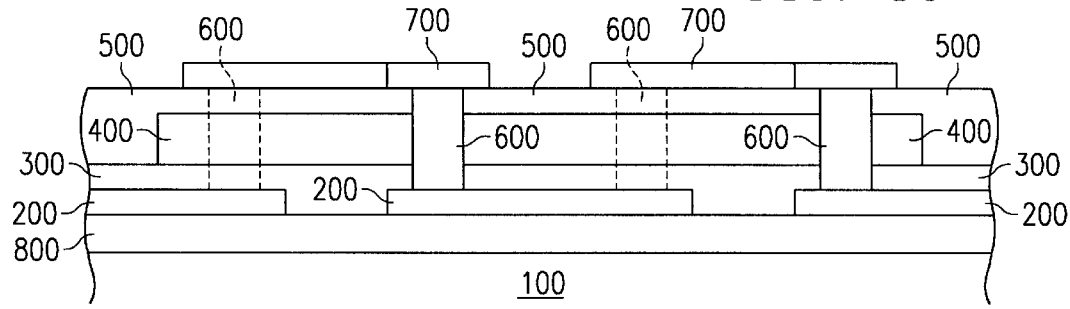

In an alternative embodiment of the instant invention, a semiconductor wafer 100 is shown in FIG. 3a. The wafer 100 may have existing circuits fabricated in other areas which are not shown for clarity. A first insulator layer 800 is formed over the substrate and comprises an oxide, polymer, polyamide, photoresist, BPSG, PSG, HSQ, spin-on-glass, aerogel, xerogel, a nitride, or a stack of any of the above. A first metal film 200 is formed on the surface of the first insulator layer 800 and patterned using known photolithographic techniques. In one embodiment the first metal film 200 comprises Al, Cu, W, Mo, Co, Pt, Pd, or any combination or stack thereof. A second insulator layer 300 is formed encasing the first metal film 200. Second insulator layer 300 preferably comprises an oxide, polymer, polyamide, photoresist, BPSG, PSG, HSQ, spin-on-glass, aerogel, xerogel, a nitride, or any combination thereof. As shown in FIG. 3b, a magnetic layer 400 is formed on the surface of the second insulator layer 300. In one embodiment, the magnetic layer 400 comprises a Ni, Ni—Cu—Cr, Mn—Zn-Ferrite film or any combination thereof or any magnetic film compatible with semiconductor processing technology. In another embodiment, the magnetic layer 400 comprises a stack of alternating layers of magnetic material and insulator material. The magnetic material in the stack may comprise Ni, Ni—Cu—Cr, Mn—Zn-Ferrite film or any magnetic film compatible with semiconductor processing technology, and the insulator material in stack comprises silicon oxide, silicon nitride, photoresist, polymers, or any insulator compatible with semiconductor processing. In another embodiment, the magnetic layer 400, comprises a suspension of magnetic material in an insulator. The suspension of magnetic material comprises Ni, Ni—Cu—Cr, Mn—Zn-Ferrite, or any magnetic material. The insulator material containing the suspension of magnetic material comprises an oxide, polymer, polyamide, photoresist, BPSG, PSG, HSQ, spin-on-glass, aerogel, xerogel, a nitride, and any combination thereof. The insulator material should comprise a material that is easily flowed onto the substrate and to which the suspension of magnetic material is easily added. The magnetic layer 400 is patterned using known photolithographic techniques. A third insulator layer 500 is formed encasing the magnetic layer 400. The third insulator layer comprises an oxide, polymer, polyamide, photoresist, BPSG, PSG, HSQ, spin-on-glass, aerogel, xerogel, a nitride, or any combination thereof. A number of openings or vias 600 are formed in the third insulator layer 500 that expose the surface of the underlying first metal film 200. A second metal 900 is formed that contacts the underlying first metal film 200 and completely fills the openings or vias 600. In one embodiment this metal comprises W, Al, Cu, Ti, TiN, or a stack thereof and is formed using known semiconductor processing technology. As shown in FIG. 3c, a third metal film 700 is formed on the surface of the third dielectric layer 500. The third metal film 700 is preferably comprised of Al, Cu, W, Mo, Co, Pt, Pd, or any combination or stack thereof and is patterned using known photolithographic techniques resulting in the structure shown in FIG. 3c. A top down of the completed structure is shown in FIG. 4.

Figure 4:
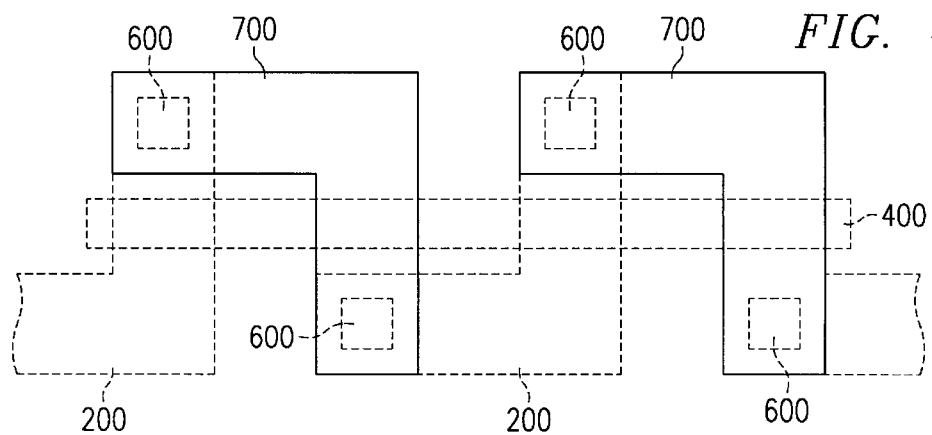
FIG. 4 is a top view of an embodiment of the instant invention.
Figure 5:
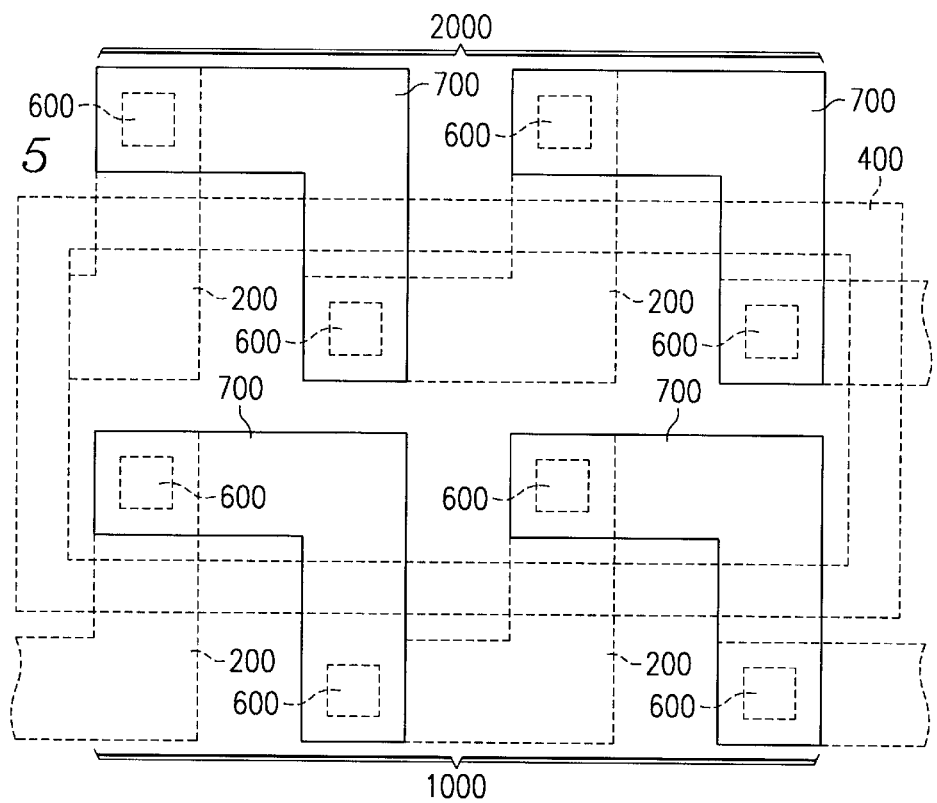
FIG. 5 is a top view of a transformer formed using an embodiment of the instant invention.

The structure illustrated in FIG. 3c and FIG. 4 form an inductor with a magnetic core. Shown in FIG. 5 is an embodiment of a transformer. The magnetic material 400 is extended to encompass two adjacent inductors 1000 and 2000. The structure is formed using the method described above and shown in FIGS. 3a–3c. In another embodiment of a transformer, the magnetic layer 400 in FIG. 5 is patterned to form a circle and the various layers 200, 700, and 600 will follow the shape of the circle. To form a toroid transformer, the layers 200, 700, and 600 will form two coils, each coil circling a semicircle of layer 400.

Figure 6:
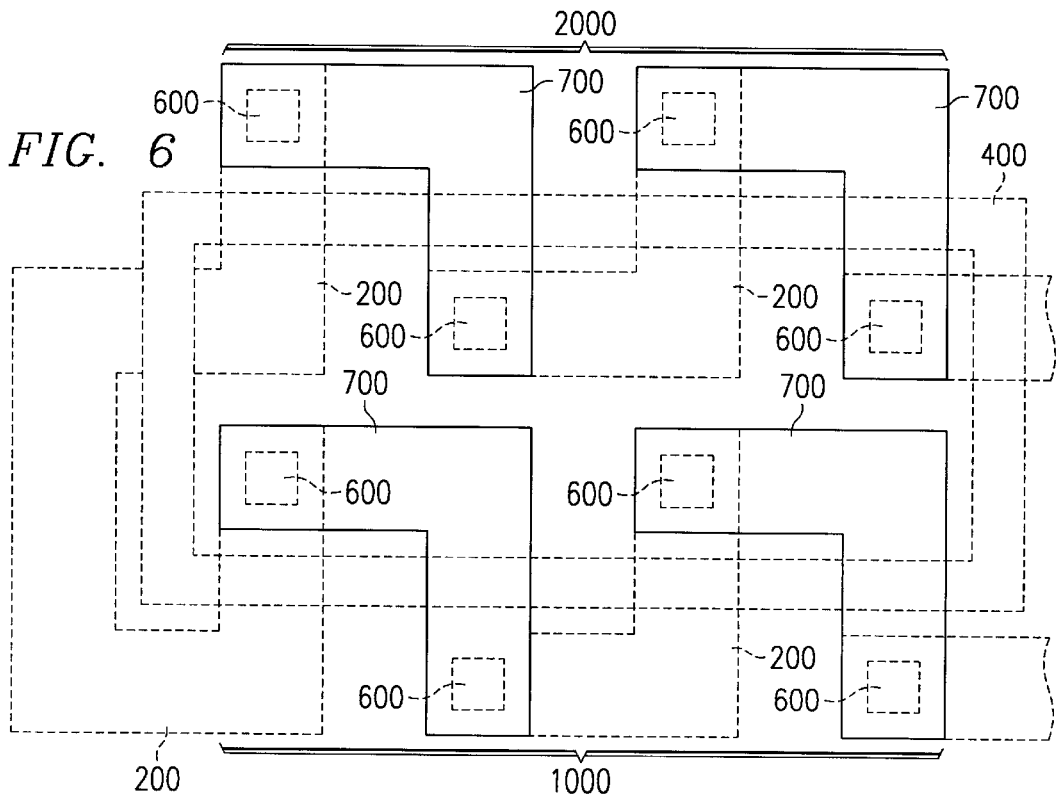
FIG. 6 is a top view of a toroidal like inductor formed using an embodiment of the instant invention

FIG. 6 illustrates another embodiment of the instant invention showing the formation of a toroid like inductor. In FIG. 6, the magnetic layer 400 could also be patterned in the form of a circle and the layers 200, 600, and 700 following the shape of the circle. In fact, any shape of the magnetic layer 400 could be used.

An advantage of the embodiment of the instant invention shown in FIG. 3c and FIG. 4 is that large value inductors can be fabricated. In addition, the embodiment facilities the fabrication of a new class of integrated circuit transformers as shown in FIG. 5.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A method of forming an inductor in a semiconductor substrate with an upper surface, said method comprising the steps of:
    forming a magnetic film on said upper surface of said semiconductor substrate;
    patterning said magnetic film using photolithography;
    forming a metal film on said upper surface of said semiconductor substrate; and
    patterning said metal film such that said metal film forms at least one coil around said magnetic film.

2. The method of claim 1, wherein said magnetic film comprises a material selected from the group consisting of:
    Ni, Ni—Cu—Cr, Mn—Zn-Ferrite, and any combination thereof.

3. The method of claim 1 wherein said magnetic film comprises a stack of alternating layers of a magnetic film and an insulating film.

4. The method of claim 1 wherein said magnetic film comprises a suspension of a magnetic material in an insulating material.

5. A method of forming an inductor in a semiconductor substrate with an upper surface, said method comprising the steps of:
    forming a first magnetic film on said upper surface of said semiconductor substrate wherein said first magnetic film has a upper surface;
    forming a first insulating layer on said upper surface of said first magnetic film wherein said first insulating layer has an upper surface;
    forming a second magnetic film on said upper surface of said first insulating layer;
    patterning said second magnetic film using photolithography;
    forming a metal film on the upper surface of said first insulating layer;
    patterning said metal film such that said metal film forms at least one coil around said second magnetic film;
    forming a second insulating layer with an upper surface on said upper surface of said first insulating layer wherein said second insulating layer completely encases said second magnetic film and said metal film; and
    forming a third magnetic film on said upper surface of said second insulating layer.

6. The method of claim 5, wherein said first magnetic film comprises a material selected from the group consisting of:
    Ni, Ni—Cu—Cr, Mn—Zn-Ferrite, and any combination thereof.

7. The method of claim 5, wherein said second magnetic film comprises a material selected from the group consisting of:
    Ni, Ni—Cu—Cr, Mn—Zn-Ferrite, and any combination thereof.

8. The method of claim 5, wherein said third magnetic film comprises a material selected from the group consisting of:
    Ni, Ni—Cu—Cr, Mn—Zn-Ferrite, and any combination thereof.

9. The method of claim 5 wherein said first magnetic film comprises a stack of alternating layers of a magnetic film and an insulating film.

10. The method of claim 5 wherein said second magnetic film comprises a stack of alternating layers of a magnetic film and an insulating film.

11. The method of claim 5 wherein said third magnetic film comprises a stack of alternating layers of a magnetic film and an insulating film.

12. The method of claim 5 wherein said first magnetic film comprises a suspension of magnetic material in an insulating material.

13. The method of claim 5 wherein said second magnetic film comprises a suspension of magnetic material in an insulating material.

14. The method of claim 5 wherein said third magnetic film comprises a suspension of magnetic material in an insulating material.

* * * * *